United States Patent
Wu et al.

(10) Patent No.: US 6,744,128 B2
(45) Date of Patent: Jun. 1, 2004

(54) INTEGRATED CIRCUIT PACKAGE CAPABLE OF IMPROVING SIGNAL QUALITY

(75) Inventors: Chung-Ju Wu, Kaohsiung (TW); Kuei-Chen Liang, Hsinchu (TW); Wei-Feng Lin, Hsinchu (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 0 days.

(21) Appl. No.: 10/262,958

(22) Filed: Oct. 3, 2002

(65) Prior Publication Data

US 2003/0122238 A1 Jul. 3, 2003

(30) Foreign Application Priority Data

Dec. 28, 2001 (TW) ........................................ 90133022 A

(51) Int. Cl.[7] .............................................. H01L 23/02
(52) U.S. Cl. ........................ 257/686; 257/777; 257/797
(58) Field of Search ................................ 257/686, 777, 257/797

(56) References Cited

U.S. PATENT DOCUMENTS 6,104,082 A * 8/2000 Berlin et al. ................ 257/665
2001/0004130 A1 * 6/2001 Higashi et al. .............. 257/686
2003/0001287 A1 * 1/2003 Sathe ........................... 257/780

* cited by examiner

Primary Examiner—Wael Fahmy
Assistant Examiner—Nathan W. Ha
(74) Attorney, Agent, or Firm—Birch, Stewart, Kolasch & Birch, LLP

(57) ABSTRACT

An integrated circuit package capable of improving signal quality is disclosed. The integrated circuit package comprises a first substrate, an integrated circuit chip attached on the first surface of the first substrate. This integrated circuit package further comprises a plurality of external terminals mounted on the first substrate and a plurality of first bonding pads mounted on the edge portion of the first surface of the first substrate and respectively connected to the corresponding external terminals. Also, the integrated circuit package further comprises a second substrate and a plurality of second bonding pads mounted on the second surface of the second substrate and connected to the first bonding pads formed on the first substrate. Furthermore, this integrated circuit package further comprises a plurality of passive components disposed on the second substrate.

11 Claims, 3 Drawing Sheets

INTEGRATED CIRCUIT PACKAGE CAPABLE OF IMPROVING SIGNAL QUALITY

This nonprovisional application claims priority under 35 U.S.C. § 119(a) on Patent Application No. 090133022 filed in Taiwan on Dec. 28, 2001, which is herein incorporated by reference.

BACKGROUND OF THE INVENTION

1. Field of the Invention

The present invention relates to electronic packages, more particularly, to an assembly of a supporting substrate having passive components and a ball grid array (BGA) substrate with an integrated circuit chip on its surface.

2. Description of the Related Art

A ball-grid array (BGA) package is an illustrative example of a surface-mount package for an integrated circuit chip. Ball-grid array (BGA) packages house an integrated circuit (IC) chip that is either wire-bonded or flip-chip mounted to bond pads on the surface of an interposer. The interposer is generally a small circuit board or a semiconductor package for interfacing a circuit board.

In high-speed digital applications, electrical interconnections associated with the chip, the interposer, and the board interconnections of a BGA can exhibit electrical resonances and reflections that degrade signal integrity and electrical system reliability. Such degradations of signal quality generally increase with increasing signal frequencies or with digital signals that exhibit short rise times. Moreover, if power supply voltages are decreased to save energy, the detrimental affects on signal integrity may increase because of lowered electrical noise immunity.

In the past, passive components such as capacitors or resistors have been placed in the signal path to reduce or eliminate unwanted resonances and signal reflections. One method employed to eliminate the conventional problems is to provide passive components located on a large-scale printed circuit board (PCB). However, this method is not sufficient to eliminate the unwanted resonances and signal reflections. Also, another method employed to eliminate the conventional problems is to provide discrete passive components interposed in the BGA substrate. However, additional assembly complexity, and reduced circuit density are incurred with the use of discrete passive components. Therefore, improved integrated circuit packages capable of improving signal quality are needed.

SUMMARY OF THE INVENTION

An object of the present invention is to provide an integrated circuit package capable of improving signal quality. The passive component density of the integrated circuit package can be increased.

Another object of the present invention is to provide an integrated circuit package capable of improving signal quality. Accordingly, the passive components are closer to the ground layer and the power layer thus further eliminating the unwanted resonances and signal reflections.

Accordingly, the objects of the invention are attained by providing an integrated circuit package capable of improving signal quality. The integrated circuit package comprises a first substrate having a first surface and a second surface; an integrated circuit chip attached on the first surface of the first substrate; a plurality of external terminals mounted on the second surface of the first substrate; a plurality of first bonding pads mounted on the edge portion of the first surface of the first substrate and respectively connected to the corresponding external terminals; a second substrate having a first surface and a second surface facing the first surface of the first substrate; a plurality of second bonding pads mounted on the second surface of the second substrate and connected to the first bonding pads formed on the first substrate; and a plurality of passive components disposed on the first surface of the second substrate to connect to the second bonding pads wherein each of the second bonding pads connects to at least one of the passive components.

Furthermore, in this integrated circuit package, the second substrate is preferably ring-shaped or a supporting frame. Also, the passive components are capacitors or resistors.

Furthermore, in the integrated circuit package capable of improving signal quality, the passive components are preferably fastened on the first surface of the second substrate by a conductive adhesive or solder.

Furthermore, the integrated circuit package capable of improving signal quality can further comprise a power layer in the first substrate in which one of the first bonding pads is electrically connected to the power layer.

Also, integrated circuit package capable of improving signal quality can further comprise a ground layer in the first substrate in which one of the first bonding pads is electrically connected to the ground layer.

Furthermore, the first bonding pads are preferably fastened to the second bonding pads by a conductive adhesive or solder.

The integrated circuit package is characterized by using an additional supporting frame (second substrate) for passive components to mount on a plastic ball grid array (PBGA) substrate (first substrate).

Also, the passive components can be connected on the second substrate in a parallel connection thus further improving signal quality.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

[First Embodiment]

Figure 1:
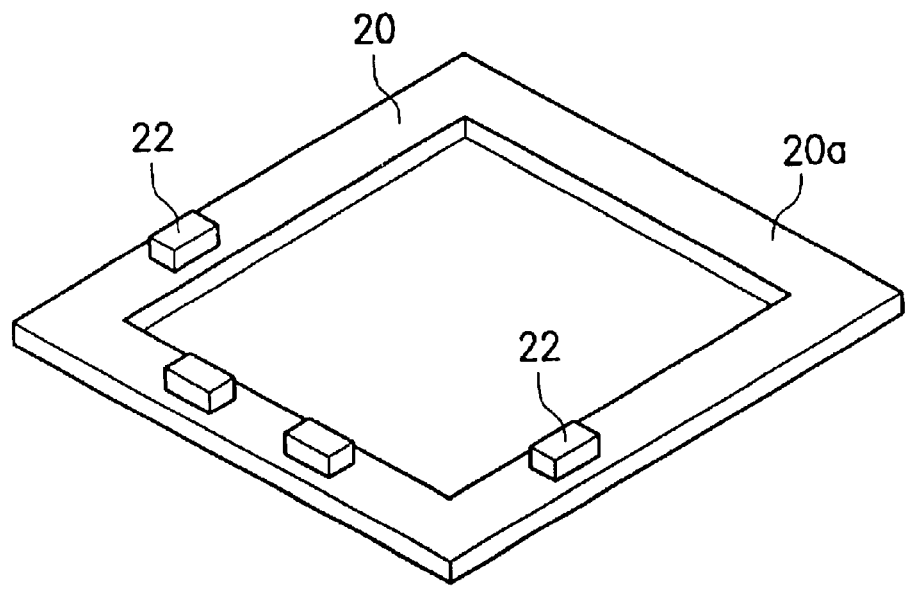
FIG. 1 is a perspective view of the second substrate (the supporting frame for passive components) according to the preferred embodiment of the invention.

As shown in FIG. 1, a supporting frame serving as the second substrate 20 is provided. Passive components 22 such as decoupling capacitors are fastened on the upper surface 20a of the second substrate 20 by a conductive adhesive or a surface mount technology (SMT) solder. Bonding pads (not shown in FIG. 1) are formed on the lower surface at a predetermined position to align with the bonding pads 14 of the plastic ball grid array (PBGA) substrate.

Figure 2:
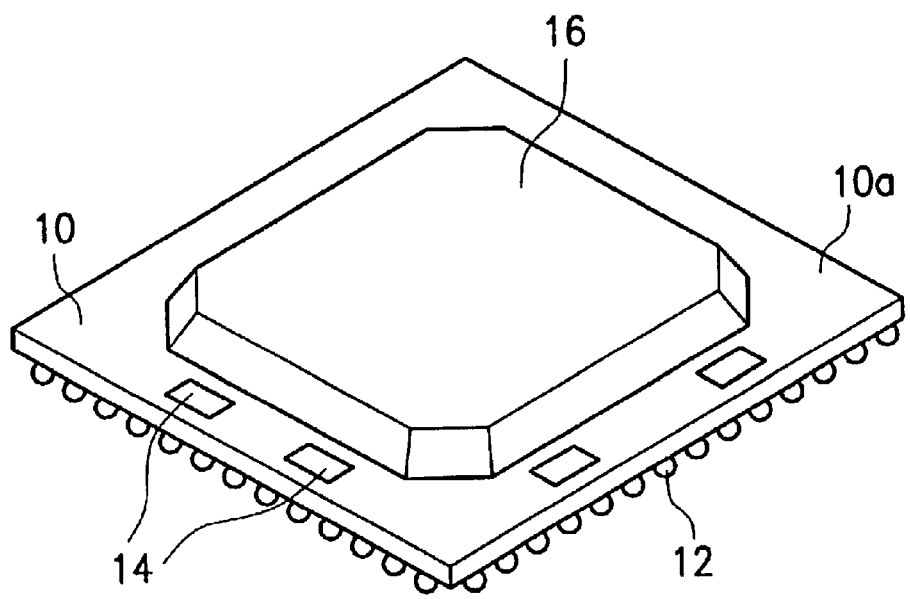
FIG. 2 is a perspective view of the first substrate (PBGA substrate) having an integrated circuit chip thereon according to the preferred embodiment of the invention.

FIG. 2 shows a plastic ball grid array (PBGA) substrate serving as the first substrate 10 having at least one signal layer S, ground layer G, and power layer P therein. An integrated circuit chip 16 is mounted on the first substrate 10. Also, metal balls serving as the external terminals 12 are formed on the lower surface 10b of the first substrate 10. Bonding pads 14, electrically connected to the bonding pads of the second substrate 20, are formed on the upper surface 10a of the first substrate 10.

Figure 3:
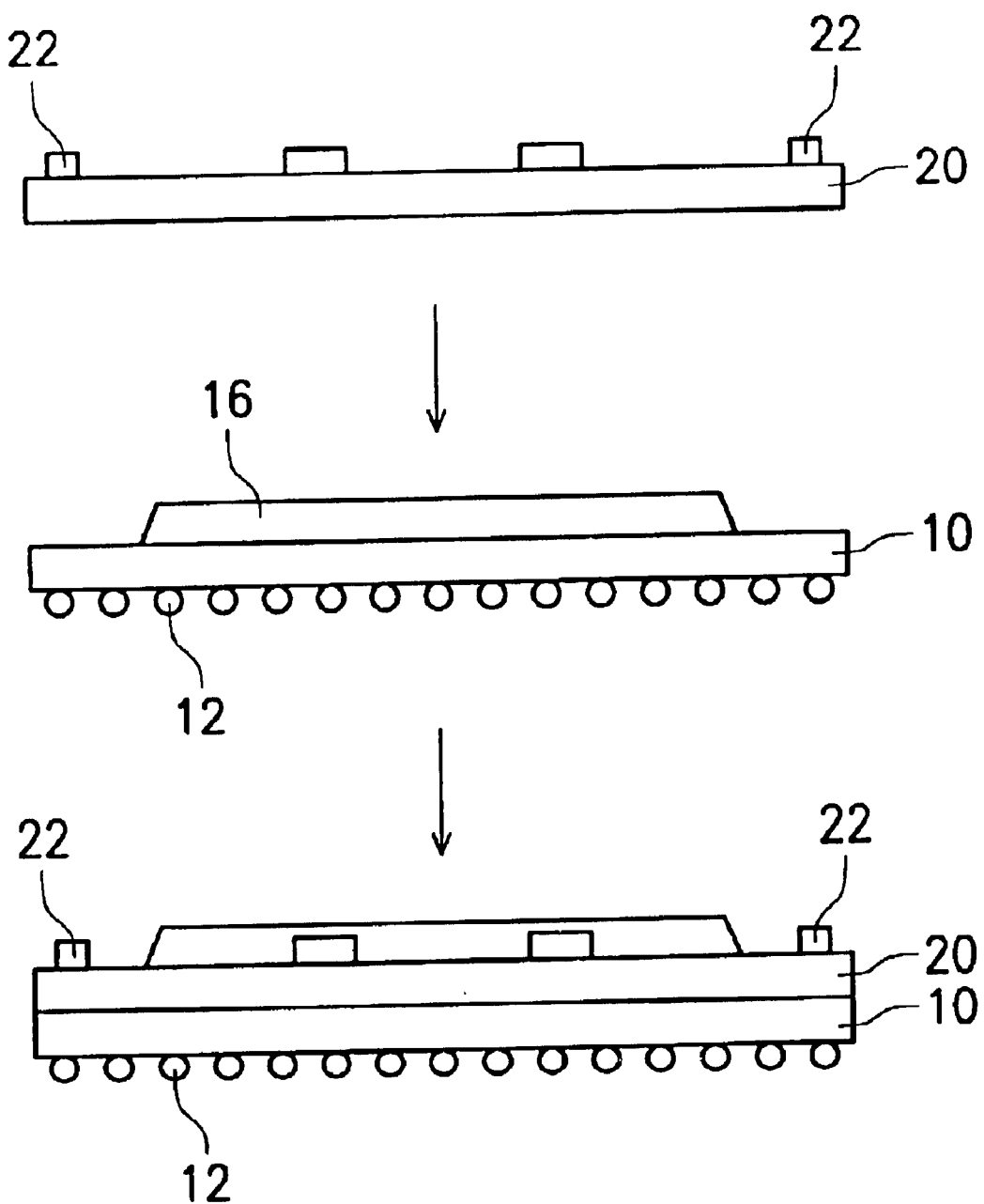
FIG. 3 is a front view showing an assembly of the first substrate and the second substrate according to the preferred embodiment of the invention.

FIG. 3 is a front view showing an assembly of the first substrate 10 and the second substrate 20. Compared to the passive components formed on the large-scale printed circuit board (PCB) according to one of the conventional techniques, the passive components 22 such as the capacitors in this embodiment are closer to the power layer P and the ground layer G within the first substrate 10. Additionally, compared to the passive components formed in the package substrate according to another conventional technique, more passive components 22 can be disposed on the frame type second substrate 20 thus further improving signal quality.

Figure 4:
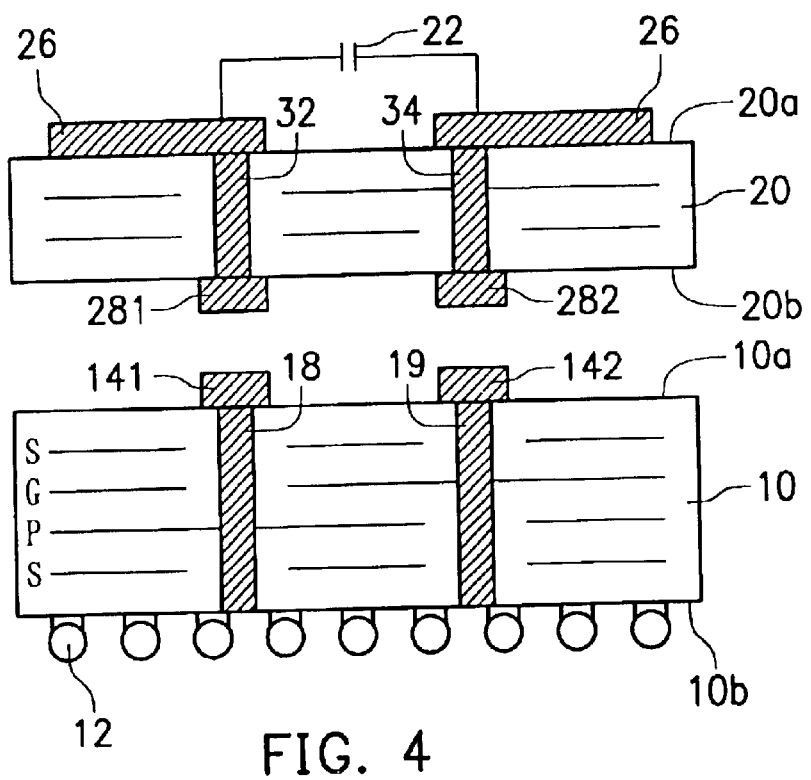
FIG. 4 is a cross-section showing the first substrate and the second substrate according to the first embodiment of the invention.

Next, FIG. 4 is a cross-section showing the first substrate 10 and the second substrate 20. Signal layer S, ground layer G, and power layer P are interposed in the first substrate 10 having a stacked structure. A metal plug 18 connects the power layer P and a bonding pad 141 formed on the upper (first) surface 10a of the first substrate 10. Also, metal plug 19 connects the ground layer G and a bonding pad 142 formed on the upper (first) surface 10a of the first substrate 10. The power layer P and the ground are connected to the external circuits through external terminals 12 consisting of metal balls.

Bonding pads 26 are located on the upper surface 20a of the second substrate 20 to connect the passive components 22 with the second substrate 20. Metal plugs 32, 34 are interposed in the second substrate 20 and respectively connected to the bonding pads 281, 282. Next, adhesive materials, such as conductive adhesives or solders, are used to fasten the bonding pads 281, 282 and the bonding pads 141, 142 formed on the upper surface 10a of the first substrate 10.

[Second Embodiment]

Figure 5:
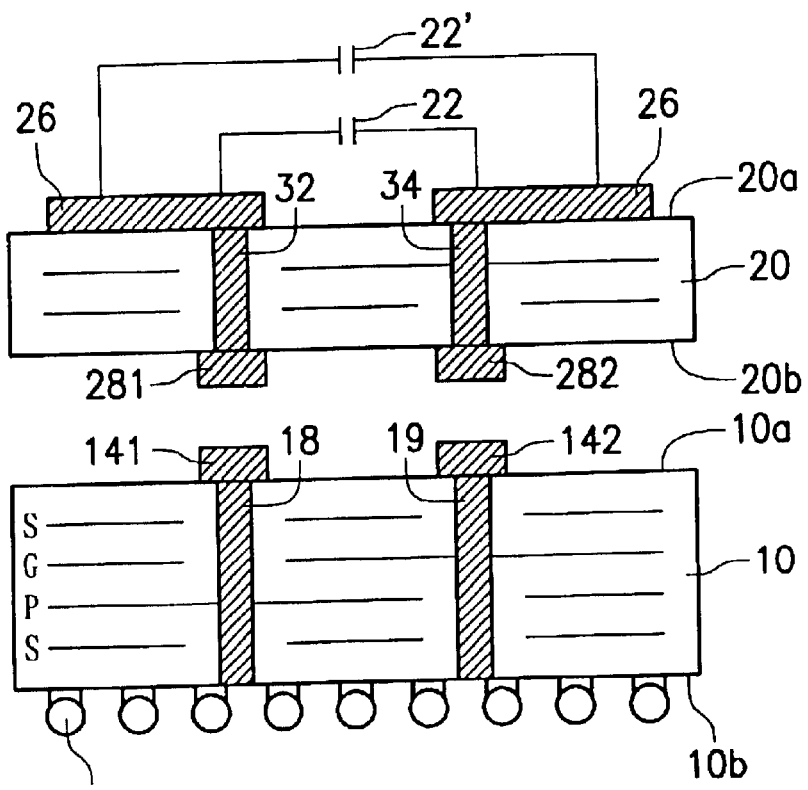
FIG. 5 is a cross-section showing the first substrate and the second substrate according to the second embodiment of the invention.

FIG. 5 is a cross-section showing the first substrate and the second substrate according to the second embodiment of the invention.

As in the first embodiment of the invention described above, capacitors 22, and 22' are connected to the bonding pads 26 in a parallel connection thus further improving signal quality.

According to the integrated circuit package of the invention, the passive components are closer to the power layer and the ground layer interposed in the PBGA substrate. Also, the more passive components can be mounted on the supporting frame. Therefore, signal quality and assembly complexity can be further improved.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An integrated circuit package capable of improving signal quality, comprising:
    a first substrate having a first surface and a second surface;
    an integrated circuit chip attached on the first surface of the first substrate;
    a plurality of external terminals mounted on the second surface of the first substrate;
    a plurality of first bonding pads mounted on the edge portion of the first surface of the first substrate, and respectively connected to the corresponding external terminals;
    a second substrate having a first surface and a second surface faced to the first surface of the first substrate, wherein the second substrate has a hollow portion being aligned to the integrated circuit chip;
    a plurality of second bonding pads mounted on the second surface of the second substrate and connected to the first bonding pads formed on the first substrate; and
    a plurality of passive components disposed on the first surface of the second substrate to connect to the second bonding, pads wherein each of the second bonding pads connects to at least one of the passive components.

2. An integrated circuit package capable of improving signal quality as claimed in claim 1, wherein the second substrate is rectangle ring-shaped.

3. An integrated circuit package capable of improving signal quality as claimed in claim 1, wherein the second substrate is a supporting frame.

4. An integrated circuit package capable of improving signal quality as claimed in claim 1, wherein the passive components are capacitors.

5. An integrated circuit package capable of improving signal quality as claimed in claim 1, wherein the passive components are fastened on the first surface of the second substrate by a conductive adhesive.

6. An integrated circuit package capable of improving signal quality as claimed in claim 1, wherein the passive components are fastened on the first surface of the second substrate by solder.

7. An integrated circuit package capable of improving signal quality as claimed in claim 1, further comprising a power layer in the first substrate in which one of the first bonding pads is electrically connected to the power layer.

8. An integrated circuit package capable of improving signal quality as claimed in claim 1, further comprising a ground layer in the first substrate in which one of the first bonding pads is electrically connected to the ground layer.

9. An integrated circuit package capable of improving signal quality as claimed in claim 1, wherein the first bonding pads are fastened to the second bonding pads by a conductive adhesive.

10. An integrated circuit package capable of improving signal quality as claimed in claim 1, wherein the first bonding pads are fastened to the second bonding pads by solder.

11. An integrated circuit package capable of improving signal quality as claimed in claim 1, wherein the passive components are disposed on the first surface of the second substrate in a parallel connection.

* * * * *